United States Patent
Jia et al.

(10) Patent No.: US 12,324,343 B2
(45) Date of Patent: Jun. 3, 2025

(54) TOP EMITTING DISPLAY PANELS AND DISPLAY DEVICES

(71) Applicants: Hefei BOE Joint Technology Co., Ltd., Anhui (CN); BOE Technology Group Co., Ltd., Beijing (CN)

(72) Inventors: Wenbin Jia, Beijing (CN); Feifei Zhu, Beijing (CN); Xiang Wan, Beijing (CN)

(73) Assignees: Hefei BOE Joint Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 81 days.

(21) Appl. No.: 17/915,742

(22) PCT Filed: Oct. 27, 2021

(86) PCT No.: PCT/CN2021/126749
§ 371 (c)(1),
(2) Date: Sep. 29, 2022

(87) PCT Pub. No.: WO2022/227452
PCT Pub. Date: Nov. 3, 2022

(65) Prior Publication Data
US 2024/0215403 A1  Jun. 27, 2024

(30) Foreign Application Priority Data
Apr. 28, 2021  (CN) .......................... 202110467080.1

(51) Int. Cl.
*H10K 59/80* (2023.01)
*H10K 59/35* (2023.01)
(52) U.S. Cl.
CPC ........... *H10K 59/876* (2023.02); *H10K 59/35* (2023.02); *H10K 59/873* (2023.02)

(58) Field of Classification Search
CPC ..... H10K 59/876; H10K 59/35; H10K 59/873
See application file for complete search history.

(56) References Cited

U.S. PATENT DOCUMENTS

2006/0097264 A1  5/2006  Kim et al.
2007/0013302 A1  1/2007  Song et al.
(Continued)

FOREIGN PATENT DOCUMENTS

CN  1805161 A  7/2006
CN  1897294 A  1/2007
(Continued)

OTHER PUBLICATIONS

CN2021104670801 first office action.
(Continued)

*Primary Examiner* — Suberr L Chi
(74) *Attorney, Agent, or Firm* — IPro, PLLC

(57) ABSTRACT

Provided are a top emitting display panel and a display device, the top emitting display panel includes a substrate, a light-emitting structure and a cover layer, wherein the light-emitting structure comprises a first light-emitting structure, a second light-emitting structure and a third light-emitting structure, and corresponding light-emitting wavelengths are a first wavelength, a second wavelength and a third wavelength respectively; the cover layer is located on a side of the light-emitting structure away from the substrate, and includes at least two of a first region located on the first light-emitting structure, a second region located on the second light-emitting structure, and a third region located on the third light-emitting structure, the first region has a thickness such that twice of the length of an equivalent optical path in the first region along a thickness direction is an integer multiple of the first wavelength; the second region has a thickness such that twice of the length of an equivalent optical path in the second region along the thickness direc- (Continued)

tion is an integer multiple of the second wavelength; and the third region has a thickness such that twice of the length of an equivalent optical path in the third region along the thickness direction is an integer multiple of the third wavelength. According to embodiments of the present disclosure, light extraction efficiencies corresponding to the first wavelength, the second wavelength, and the third wavelength can be simultaneously increased, and the display panel have a reduced power consumption and an improved lifetime.

20 Claims, 1 Drawing Sheet

(56) References Cited

U.S. PATENT DOCUMENTS

| | | | |
|---|---|---|---|
| 2008/0237615 A1 | 10/2008 | Lee et al. | |
| 2010/0072883 A1* | 3/2010 | Hwang | H10K 50/852 |
| | | | 257/E21.532 |
| 2010/0320446 A1 | 12/2010 | Kang et al. | |
| 2011/0084291 A1 | 4/2011 | Jeong et al. | |
| 2011/0140139 A1 | 6/2011 | Jeong et al. | |
| 2014/0014926 A1 | 1/2014 | Hsu et al. | |
| 2015/0021582 A1 | 1/2015 | Weaver et al. | |
| 2015/0137082 A1 | 5/2015 | Kim et al. | |
| 2015/0187847 A1 | 7/2015 | Choi | |
| 2017/0104036 A1 | 4/2017 | Maeda | |
| 2017/0373277 A1 | 12/2017 | Noh et al. | |
| 2020/0321560 A1 | 10/2020 | Wang | |

FOREIGN PATENT DOCUMENTS

| | | |
|---|---|---|
| CN | 102044555 A | 5/2011 |
| CN | 104091895 A | 10/2014 |
| CN | 104659053 A | 5/2015 |
| CN | 104752475 A | 7/2015 |
| CN | 105098094 A | 11/2015 |
| CN | 106571431 A | 4/2017 |
| CN | 107134536 A | 9/2017 |
| CN | 107546333 A | 1/2018 |
| CN | 107958963 A | 4/2018 |
| CN | 108281465 A | 7/2018 |
| CN | 108365115 A | 8/2018 |
| CN | 108807716 A | 11/2018 |
| CN | 208256731 U | 12/2018 |
| CN | 109686864 A | 4/2019 |
| CN | 109728198 A | 5/2019 |
| CN | 110890478 A | 3/2020 |
| CN | 111129359 A | 5/2020 |
| CN | 113193150 A | 7/2021 |
| IN | 103000824 A | 3/2013 |
| JP | 2000277266 A | 10/2000 |
| JP | 2004127588 A | 4/2004 |
| JP | 2008218081 A | 9/2008 |
| KR | 20060060171 A | 6/2006 |
| KR | 20070065647 A | 6/2007 |
| TW | 201403901 A | 1/2014 |

OTHER PUBLICATIONS

CN2021104670801 second office action.
CN2021104670801 third office action.
PCT/CN2021/126749 international search report.
PCT/CN2021/126749 Written Opinion.

* cited by examiner

TOP EMITTING DISPLAY PANELS AND DISPLAY DEVICES

CROSS-REFERENCE TO RELATED APPLICATIONS

This application is the U.S. national phase of PCT Application No. PCT/CN2021/126749 filed on Oct. 27, 2021, which claims the benefit of Chinese Patent Application No. 202110467080.1 entitled "TOP EMITTING DISPLAY PANELS AND DISPLAY DEVICES" filed with the Chinese Patent Office on Apr. 28, 2021, the entire contents of which are incorporated herein by reference.

TECHNICAL FIELD

This disclosure relates to a technical field of display devices, and more particularly, to top emitting display panels and display devices.

BACKGROUND

Organic Light-Emitting Diodes (OLEDs), as a new type of light-emitting device, has shown great application potential in fields of display and lighting and has attracted strong attention from academia and industry. In the field of display, OLEDs have advantages of self-emission, fast response, wide viewing angle, high brightness, bright color, light and thin, and the like as compared to LCDs and are considered as next generation display technologies.

Conventional OLED devices typically consist of an anode layer, a light emitting layer, and a cathode layer, which can be divided into two types of bottom emission and top emission depending on light emitting surfaces. Because the top emitting device can obtain a larger aperture ratio, it has become a research focus in recent years.

In practical, an OLED device has an external quantum efficiency (EQE) much lower than theoretical light extraction efficiency of the OLED. The external quantum efficiency of OLED is mainly affected by an exciton conversion efficiency of the OLED itself, an internal conversion efficiency of the exciton itself, transportation and consumption of light at an interface of the OLED, a plasma effect of the OLED itself at a metal interface, a total reflection effect and the like. Therefore, how to improve the light production of OLED display devices is a common and critical problem in the industry.

SUMMARY

The present disclosure provides a top-emitting display panel and a display device to solve issues present in the related art.

To achieve above objects, a first aspect of embodiments of the present disclosure provides a top-emitting display panel, comprising:
 a substrate;
 a light-emitting structure located on the substrate, the light-emitting structure comprising: a first light-emitting structure which has a first wavelength as a light emitting wavelength thereof, a second light-emitting structure which has a second wavelength as a light emitting wavelength thereof, and a third light-emitting structure which has a third wavelength as a light emitting wavelength thereof, where the first wavelength is greater than the second wavelength, and the second wavelength is greater than the third wavelength;
 a cover layer located on a side of the light-emitting structure away from the substrate and comprising at least two of a first region located on the first light-emitting structure, a second region located on the second light-emitting structure, and a third region located on the third light-emitting structure, wherein the first region has a thickness such that twice of the length of an equivalent optical path in the first region along a thickness direction is an integer multiple of the first wavelength; the second region has a thickness such that twice of the length of an equivalent optical path in the second region along the thickness direction is an integer multiple of the second wavelength; and the third region has a thickness such that twice of the length of an equivalent optical path in the third region along the thickness direction is an integer multiple of the third wavelength.

Optionally, the cover layer includes a first region located on the first light-emitting structure, a second region located on the second light-emitting structure, and a third region located on the third light-emitting structure.

Optionally, the cover layer comprises an optical adjusting layer and/or a planarization layer.

Optionally, the optical adjusting layer includes silicon nitride, silicon dioxide, silicon oxynitride, IZO, ITO, polymer resin or PI.

Optionally, the planarization layer includes PI or SOG.

Optionally, the optical adjusting layer has an extinction coefficient not greater than 0.05 in a visible wavelength range.

Optionally, the planarization layer has an extinction coefficient of 0 to 0.1 in a visible wavelength range.

Optionally, the first light-emitting structure is a red light-emitting structure, the second light-emitting structure is a green light-emitting structure, and the third light-emitting structure is a blue light-emitting structure.

Optionally, a red organic layer of the red light-emitting structure and/or a green organic layer of the green light-emitting structure and/or a blue organic layer of the blue light-emitting structure are formed by printing or evaporation.

Optionally, a color filter layer is provided between the cover layer and the light-emitting structure.

A second aspect of embodiments of the present disclosure provides a display device comprising: a top emitting display panel according to any one of those described above.

According to the above embodiments of the present disclosure, the cover layer forms different micro resonators for different wavelengths of the light emitting structures, thereby improving light extraction efficiencies at corresponding wavelengths. Therefore, the display panel may have a reduced power consumption and an improved lifetime.

It is to be understood that both the foregoing general description and the following detailed description are exemplary and explanatory only and are not restrictive of the present disclosure.

BRIEF DESCRIPTION OF THE DRAWINGS

The accompanying drawings, which are incorporated in and constitute a part of this specification, illustrate embodiments consistent with the present disclosure and together with the description, serve to explain the principles of the present disclosure.

LIST OF REFERENCE NUMBERS

Top Emitting Display Panels 1, 2, 3
Substrate 10
Light Emitting Structure 11
First Light-Emitting Structure 111
Second Light-Emitting Structure 112
Third Light-Emitting Structure 113
First Wavelength $\lambda 1$
Second Wavelength $\lambda 2$
Third Wavelength $\lambda 3$
Cover Layer 12, 12'
First Area 121
Second Area 122
Third Area 123
Planarization Layer 12b
Optical Adjustment Layer 12a
Color Filter Layer 13
First Color Filter Block 131
Second Color Filter Block 132
Third Color Filter Block 133
Light shielding structure 14

DETAILED DESCRIPTION OF THE EMBODIMENTS

Reference will be made herein in detail to exemplary embodiments, examples of which are illustrated in the accompanying drawings. When the following description refers to the accompanying drawings, the same numbers in different drawings represent the same or similar elements unless otherwise represented. Implementations described in the following exemplary embodiments do not represent all implementations consistent with the present disclosure. Instead, they are merely examples of devices and methods consistent with some aspects of the present disclosure as detailed in the appended claims.

Figure 1:
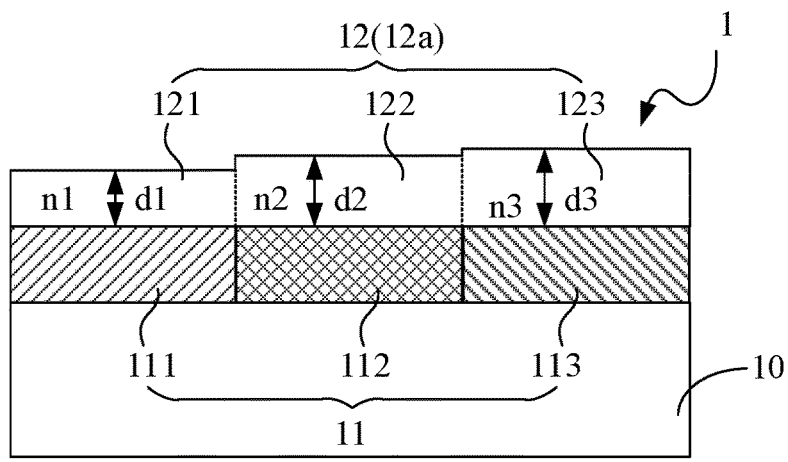
FIG. 1 is a cross-sectional view of a top emission display panel according to a first embodiment of the present disclosure.

FIG. 1 is a cross-sectional view of a top emission display panel according to a first embodiment of the present disclosure.

Referring to FIG. 1, a top-emitting display panel 1 includes:
  a substrate 10;
  a light-emitting structure 11 located on the substrate 10, the light-emitting structure 11 comprising: a first light-emitting structure 111 which has a first wavelength $\lambda 1$ as a light emitting wavelength thereof, a second light-emitting structure 112 which has a second wavelength $\lambda 2$ as a light emitting wavelength thereof, and a third light-emitting structure 113 which has a third wavelength $\lambda 3$ as a light emitting wavelength thereof, where the first wavelength $\lambda 1$ is greater than the second wavelength $\lambda 2$, and the second wavelength $\lambda 2$ is greater than the third wavelength $\lambda 3$;
  a cover layer 12 located on a side of the light-emitting structure 11 away from the substrate 10) and comprising a first region 121 located on the first light-emitting structure 111, a second region 122 located on the second light-emitting structure 112, and a third region 123 located on the third light-emitting structure 113, where the first region 121 has a thickness such that twice of the length of an equivalent optical path in the first region along a thickness direction is an integer multiple of the first wavelength $\lambda 1$; the second region 122 has a thickness such that twice of the length of an equivalent optical path in the second region along the thickness direction is an integer multiple of the second wavelength $\lambda 2$; and the third region 123 has a thickness such that twice of the length of an equivalent optical path in the third region along the thickness direction is an integer multiple of the third wavelength $\lambda 1$.

The substrate 10 may be a soft substrate, such as polyimide. The substrate 10 may also be a hard substrate, such as glass.

In this embodiment, the first light-emitting structure 111 may be a red light-emitting structure, the second light-emitting structure 112 may be a green light-emitting structure, and the third light-emitting structure 113 may be a blue light-emitting structure.

The red light emitting structure may include a first anode, a first cathode, and a red light emitting layer disposed between the first anode and the first cathode. The green light emitting structure may include a second anode, a second cathode, and a green light emitting layer disposed between the second anode and the second cathode. The blue light emitting structure may include a third anode, a third cathode, and a blue light emitting layer disposed between the third anode and the third cathode.

The red light emitting layer, the green light emitting layer and the blue light emitting layer may be made of organic light emitting materials (OLED). The organic light emitting material may be formed by printing or evaporation.

The first anode, the second anode, and the third anode may be made of a reflective material. The reflective material may include silver (Ag) and alloys thereof, aluminum (Al) and alloys thereof, such as silver (Ag), an alloy of silver and lead (Ag:Pb), an alloy of aluminum and neodymium (Al:Nd), an alloy of silver, platinum and copper (Ag:Pt:Cu), or the like. When silver and its alloy are used as the reflective material, a layer of ITO, IZO or IGZO may be disposed between the first anode, the second anode and the third anode and the organic light emitting material, respectively.

The first cathode, the second cathode and the third cathode may be made of a partially light transmissive, partially reflective material (a transflective material). The first cathode, the second cathode, and the third cathode may be a single layer structure, and the single layer structure may include at least one of magnesium, silver and aluminum, such as a mixture of magnesium and silver or a mixture of aluminum and silver. The first cathode, the second cathode and the third cathode may also be a three-layer structure of a transparent conductive layer, a middle layer and another transparent conductive layer. The transparent conductive layer may include at least one of ITO, IZO and IGZO, and the intermediate layer may include at least one of magnesium, silver, aluminum, such as a mixture of magnesium and silver or a mixture of aluminum and silver. In other words, the first light-emitting structure 111, the second light-emitting structure 112, and the third light-emitting structure 113 are provided as a top-emitting structure.

The first cathode, the second cathode, and the third cathode may be connected together to form a face electrode.

The light emitting structures 11 with three primary colors of red, green and blue form a light emitting unit.

In other embodiments, a light-emitting unit may also be formed by using the light-emitting structures 11 with four primary colors of red, green, blue and yellow.

The light emitting structure 11 may be an active matrix OLED (AMOLED). In other words, pixel driving circuits are disposed between the first anode, the second anode, and the third anode and the substrate 10 respectively.

An active matrix OLED, also referred to as an actively driven light-emitting OLED, can control each of pixels to emit light by using an array of transistors, and each of the light-emitting structures 11 can emit light continuously. That is, each of the light-emitting structures 11 is addressed under control of the array of transistors directly.

In other embodiments, the light-emitting structures 11 may be a passively driven light-emitting OLED. At this time, there is no pixel driving circuit between the first anode, the second anode, and the third anode and the substrate 10 respectively.

In the present embodiment, referring to FIG. 1, the cover layer 12 includes only the optical adjusting layer 12a.

The optical adjusting layer 12a may have a thickness of d1 in the first region 121 and may have a refractive index of n1 for light having the first wavelength λ1; the optical adjusting layer 12a may have a thickness of d2 in the second region 122 and may have a refractive index of n2 for light having the second wavelength λ2; and the optical adjusting layer 12a may have a thickness of d3 in the third region 123 and may have a refractive index of n3 for light having the third wavelength λ3. There are following conditions:

$2*n1*d1=P1*\lambda1$, P1 being any positive integer;

$2*n2*d2=Q1*\lambda2$, Q1 being any positive integer; and $2*n3*d3=M1*\lambda3$, M1 being any positive integer.

The first region 121, the second region 122, and the third region 123 satisfying the above conditions are less reflective at a light output interface and form a micro-resonator, while light extraction efficiencies corresponding to the first wavelength λ1, the second wavelength λ2, and the third wavelength λ3 are increased. Thus, the display panel may have a reduced power consumption and an improved lifetime.

It should be noted that, for the light emitting structure 11 formed by using a printing method to form the organic light emitting material, if the light emitting structure 11 has a reduced light extraction efficiency due to a printing amount which fails to be controlled precisely, the light extraction efficiencies corresponding to the first wavelength λ1, the second wavelength λ2, and the third wavelength λ3 can be significantly increased.

In other embodiments, the cover layer 12 may further include two of the first region 121 located on the first light-emitting structure 111, the second region 122 located on the second light-emitting structure 112, and the third region 123 located on the third light-emitting structure 113. For example, when the cover layer 12 includes the first region 121 and the second region 122, the first region 121 and the second region 122 satisfying the above-mentioned condition are less reflective at the light output interface, and the micro-resonator is formed, and the light extraction efficiencies corresponding to the first wavelength λ1 and the second wavelength λ2 can be increased.

The optical adjusting layer 12a may include silicon nitride, silicon dioxide, silicon oxynitride, IZO (Indium Zinc oxide), ITO (Indium Tin oxide), polymer resin or PI (polyimide).

The optically adjusting layer 12a in the respective regions may have different materials and/or thicknesses by a patterning process.

In addition, the optical adjusting layer 12a preferably has a small extinction coefficient in a visible wavelength range, so as to avoid strong absorption to waves by itself and enhance the light extraction efficiency. The optical adjusting layer 12a preferably has an extinction coefficient not greater than 0.05 in the visible wavelength range. The visible light wavelength range is from 380 nm to 780 nm.

Figure 2:
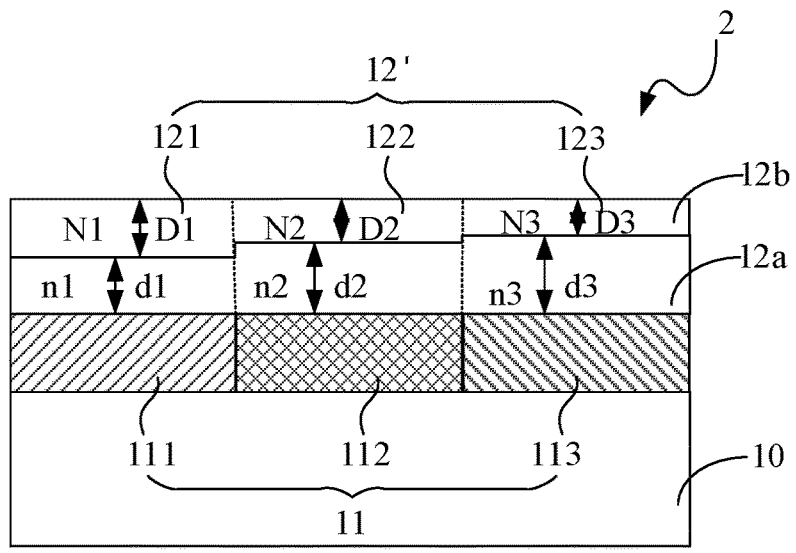
FIG. 2 is a cross-sectional view of a top emission display panel according to a second embodiment of the present disclosure.

FIG. 2 is a cross-sectional view of a top emission display panel according to a second embodiment of the present disclosure.

Referring to FIG. 2, the top-emitting display panel 2 of this embodiment is substantially the same as the top-emitting display panel 1 of FIG. 1, except that the cover layer 12' includes the optical adjusting layer 12a and a planarization layer 12b.

The optical adjusting layer 12a may have a thickness of d1 in the first region 121 and may have a refractive index of n1 for light having the first wavelength λ1; the optical adjusting layer 12a may have a thickness of d2 in the second region 122 and may have a refractive index of n2 for light having the second wavelength λ2; and the optical adjusting layer 12a may have a thickness of d3 in the third region 123 and may have a refractive index of n3 for light having the third wavelength λ3. The planarization layer 12b may have a thickness of D1 in the first region 121 and may have a refractive index of N1 for light having the first wavelength λ1; the planarization layer 12b may have a thickness of D2 in the second region 122 and may have a refractive index of N2 for light having the second wavelength λ2; and the planarization layer 12b may have a thickness of D3 in the third region 123 and may have a refractive index of N3 for light having the third wavelength λ3. For forming total reflection at an interface in a light output direction, N1<n1, N2<n2, and N2<2N3<n3.

There are following conditions:

$2*(n1*d1+N1*D1)=P2*\lambda1$, P2 is any positive integer;

$2*(n2*d2+N2*D2)=Q2*\lambda2$, Q2 is any positive integer;

$2*(n3*d3+N3*D3)=M2*\lambda3$, M2 is any positive integer.

The first region 121, the second region 122, and the third region 123 satisfying the above conditions are less reflective at the light output interface and form a micro-resonator, while light extraction efficiencies corresponding to the first wavelength λ1, the second wavelength λ2, and the third wavelength λ3 are increased. Thus, the display panel may have a reduced power consumption and an improved lifetime.

In other embodiments, the cover layer 12' may further include two of the first region 121 located on the first light-emitting structure 111, the second region 122 located on the second light-emitting structure 112, and the third region 123 located on the third light-emitting structure 113. For example, when the cover layer 12' includes the first region 121 and the second region 122, the first region 121 and the second region 122 satisfying the above-mentioned condition are less reflective at the light output interface, and the micro-resonator is formed, and the light extraction efficiencies corresponding to the first wavelength λ1 and the second wavelength λ2 can be increased.

To verify above technical effects, this embodiment performs an optical simulation. It can be seen by the optical simulation that, in each region of the cover layer 12', when a single optical path is equal to an integer multiple of a corresponding half wavelength, the light extraction efficiency of each light emitting structure can be improved. In addition, the optical adjusting layer 12a and the planarization layer 12b together affect the light extraction efficiency. Third, respective parameters of the optically adjusting layer 12a affect the light extraction efficiency more than respective parameters of the planarization layer 12b.

The optical adjusting layer 12a may include silicon nitride, silicon dioxide, silicon oxynitride, IZO, ITO, polymer resin or PI; and the planarization layer 12b may include PI or SOG (organic siloxane resin).

In addition, the planarization layer 12b preferably has a small extinction coefficient in the visible wavelength range, so as to avoid strong absorption to waves by itself and enhance the light extraction efficiency. The extinction coefficient of the planarization layer 12b in the visible wavelength range may be 0 to 0.1. In the present embodiment, numerical ranges are inclusive of values of endpoints.

In other embodiments, the cover layer 12' may comprise the planarization layer 12b only. At least two of the first region 121, the second region 122, and the third region 123 satisfy the aforementioned resonant cavity condition.

Figure 3:
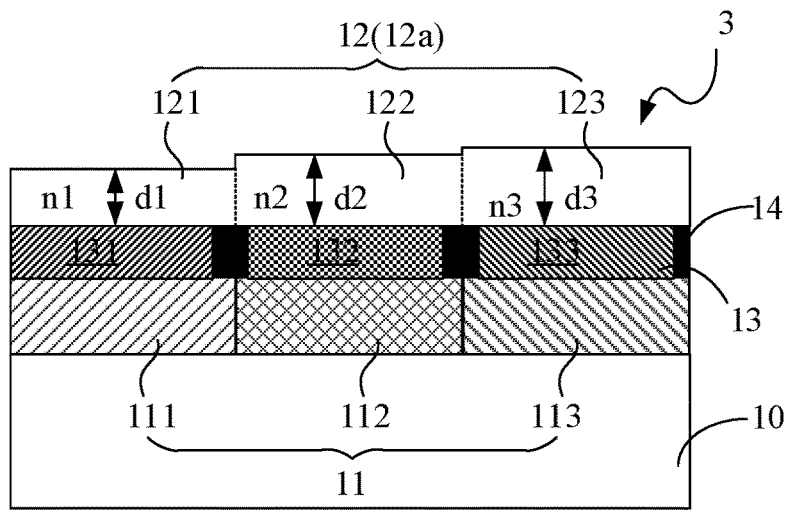
FIG. 3 is a cross-sectional view of a top emission display panel according to a third embodiment of the present disclosure.

FIG. 3 is a cross-sectional view of a top emission display panel according to a third embodiment of the present disclosure.

Referring to FIG. 3, the top-emission display panel 3 of the present embodiment is substantially the same as the top-emission display panels 1 and 2 of FIGS. 1 and 2, except that a color filter layer 13 is provided between the cover layer 12 and the light-emitting structures 11.

The color filter layer 13 may include a first color filter block 131, a second color filter block 132, and a third color filter block 133. The first color filter block 131 allows the first wavelength $\lambda 1$ of the first light-emitting structure 111 to pass; the second color filter block 132 allows the second wavelength $\lambda 2$ of the second light-emitting structure 112 to pass; and the third color filter block 133 allows the third wavelength $\lambda 3$ of the third light-emitting structure 113 to pass.

In this embodiment, the first color filter block 131 is a red filter block, the second color filter block 132 is a green filter block, and the third color filter block 133 is a blue filter block.

A light-shielding structure 14, such as a black matrix, is provided between adjacent color filter blocks.

The optical adjusting layer 12a in the respective regions may have different materials and/or thicknesses by a patterning process. Generally, there is a joint part between adjacent regions of the optical adjusting layer 12a. The light shielding structure 14 may correspond to the joint part and may shield for the joint part.

The color filter layer 13 may improve an emission monochromaticity corresponding to the first wavelength $\lambda 1$, the second wavelength $\lambda 2$, and the third wavelength $\lambda 3$.

Based on the top-emitting display panels 1, 2, 3, an embodiment of the present disclosure further provides a display device including any of the top-emitting display panels 1, 2, 3. The display device may be an electronic paper, a cell phone, a tablet, a television, a laptop, a digital picture frame, a navigator, or any product or component having a display function.

It is noted that in the drawings, the dimensions of layers and regions may be exaggerated for clarity of illustration. It will also be understood that when an element or layer is referred to as being "on" another element or layer, it can be directly on the other element or intervening layers may be present. In addition, it will be understood that when an element or layer is referred to as being "under" another element or layer, it can be directly under the other element or more than one intervening layer or element may be present. In addition, it will also be understood that when a layer or element is referred to as being "between" two layers or elements, it can be the only layer between the two layers or elements, or more than one intervening layer or element may also be present. Like reference numerals refer to like elements throughout.

In this disclosure, the terms "first" and "second" are used for descriptive purposes only and are not to be construed as indicating or implying relative importance. The term "plurality" means one, two, or more than two, unless expressly defined otherwise.

Other embodiments of the present disclosure will be apparent to those skilled in the art from consideration of the specification and practice of the disclosure disclosed herein. This disclosure is intended to cover any variations, uses, or adaptations of the present disclosure which follow the general principles of the present disclosure, and which include common general knowledge or customary practice in the art to which the present disclosure is not disclosed. It is intended that the specification and embodiments can be considered as exemplary only, with a true scope and spirit of the present disclosure being indicated by the following claims.

It is to be understood that the present disclosure is not limited to the precise construction described above and illustrated in the drawings, and that various modifications and changes may be made without departing from the scope thereof. The scope of the present disclosure is limited only by the following claims.

The invention claimed is:

1. A top emitting display panel, comprising:
a substrate;
a light-emitting structure located on the substrate, the light-emitting structure comprising:
a first light-emitting structure which has a first wavelength as a light emitting wavelength thereof,
a second light-emitting structure which has a second wavelength as a light emitting wavelength thereof, and
a third light-emitting structure which has a third wavelength as a light emitting wavelength thereof,
wherein the first wavelength is greater than the second wavelength, and the second wavelength is greater than the third wavelength;
a cover layer located on a side of the light-emitting structure away from the substrate and comprising at least two of a first region located on the first light-emitting structure, a second region located on the second light-emitting structure, and a third region located on the third light-emitting structure, wherein
the first region has a thickness such that twice of a length of an equivalent optical path in the first region along a thickness direction is an integer multiple of the first wavelength;
the second region has a thickness such that twice of the length of an equivalent optical path in the second region along the thickness direction is an integer multiple of the second wavelength; and
the third region has a thickness such that twice of a length of an equivalent optical path in the third region along the thickness direction is an integer multiple of the third wavelength.

2. The top emitting display panel according to claim 1, wherein the cover layer comprises:
the first region located on the first light-emitting structure,
the second region located on the second light-emitting structure, and
the third region located on the third light-emitting structure.

3. The top emitting display panel according to claim 1, wherein the cover layer comprises at least one of:
an optical adjusting layer, or
a planarization layer.

4. The top emitting display panel according to claim 3, wherein the optical adjusting layer is made of a material comprising at least one of silicon nitride, silicon dioxide, silicon oxynitride, IZO, ITO, polymer resin or PI.

5. The top emitting display panel according to claim 3, wherein the planarization layer is made of a material comprising at least one of PI or SOG.

6. The top emitting display panel according to claim 3, wherein the optical adjusting layer has an extinction coefficient not greater than 0.05 in a visible wavelength range.

7. The top emitting display panel according to claim 3, wherein the planarization layer has an extinction coefficient of 0 to 0.1 in a visible wavelength range.

8. The top emitting display panel according to claim 1, wherein
the first light-emitting structure is a red light-emitting structure,
the second light-emitting structure is a green light-emitting structure, and
the third light-emitting structure is a blue light-emitting structure.

9. The top emitting display panel according to claim 8, wherein at least one of following is formed by printing or evaporation:
a red organic layer of the red light-emitting structure,
a green organic layer of the green light-emitting structure, and
a blue organic layer of the blue light-emitting structure.

10. The top emitting display panel according to claim 1, wherein a color filter layer is provided between the cover layer and the light-emitting structure.

11. A display device comprising the top-emitting display panel according to claim 1.

12. The display device according to claim 11, wherein the cover layer comprises:
the first region located on the first light-emitting structure,
the second region located on the second light-emitting structure, and
the third region located on the third light-emitting structure.

13. The display device according to claim 11, wherein the cover layer comprises at least one of:
an optical adjusting layer, or
a planarization layer.

14. The display device according to claim 13, wherein the optical adjusting layer is made of a material comprising at least one of silicon nitride, silicon dioxide, silicon oxynitride, IZO, ITO, polymer resin or PI.

15. The display device according to claim 13, wherein the planarization layer is made of a material comprising at least one of PI or SOG.

16. The display device according to claim 13, wherein the optical adjusting layer has an extinction coefficient not greater than 0.05 in a visible wavelength range.

17. The display device according to claim 13, wherein the planarization layer has an extinction coefficient of 0 to 0.1 in a visible wavelength range.

18. The display device according to claim 11, wherein
the first light-emitting structure is a red light-emitting structure,
the second light-emitting structure is a green light-emitting structure, and
the third light-emitting structure is a blue light-emitting structure.

19. The display device according to claim 18, wherein at least one of following is formed by printing or evaporation:
a red organic layer of the red light-emitting structure,
a green organic layer of the green light-emitting structure, and
a blue organic layer of the blue light-emitting structure.

20. The display device according to claim 11, wherein a color filter layer is provided between the cover layer and the light-emitting structure.

* * * * *